United States Patent [19]

Parsons et al.

[11] Patent Number: 5,200,805
[45] Date of Patent: Apr. 6, 1993

[54] SILICON CARBIDE:METAL CARBIDE ALLOY SEMICONDUCTOR AND METHOD OF MAKING THE SAME

[75] Inventors: James D. Parsons, Newbury Park; Oscar Stafsudd, Los Angeles, both of Calif.

[73] Assignee: Hughes Aircraft Company, Los Angeles, Calif.

[21] Appl. No.: 138,411

[22] Filed: Dec. 28, 1987

[51] Int. Cl.$^5$ .................... H01L 29/161; H01L 29/20; H01L 29/22; H01L 29/24

[52] U.S. Cl. ..................................... 257/77; 257/613; 252/62.3 C

[58] Field of Search .................................. 357/61, 23.2

[56] References Cited

U.S. PATENT DOCUMENTS

| | | | |
|---|---|---|---|
| 3,047,439 | 7/1962 | Daal et al. | 252/623 C |
| 3,201,666 | 8/1965 | Hall | 148/DIG. 148 |
| 3,517,281 | 6/1970 | Mlavsky et al. | 148/DIG. 148 |
| 3,577,285 | 5/1971 | Rutz | 357/61 |
| 3,602,777 | 8/1971 | Berman | 357/61 |
| 3,607,448 | 9/1971 | Dunlap | 357/61 |
| 3,662,458 | 5/1972 | Formigoni et al. | 357/61 |
| 3,972,749 | 8/1976 | Pavlichenko | 357/61 |
| 4,028,149 | 6/1977 | Deines et al. | 357/61 |
| 4,161,743 | 7/1979 | Yonezawa et al. | 357/63 X |
| 4,912,063 | 3/1990 | Davis et al. | 437/100 |

FOREIGN PATENT DOCUMENTS

| | | | |
|---|---|---|---|
| 0251127 | 5/1963 | Australia | 357/61 |
| 0107356 | 5/1984 | European Pat. Off. | |
| 51-20869 | 6/1976 | Japan | 437/100 |

OTHER PUBLICATIONS

Ghandhi, *VLSI Fabrication Principles*, 1983, pp. 214–216 and pp. 250, 453–455.
Journal of Electromechanical Society, vol. 133, No. 11, Nov. 1986 (Manchester, N.H. U.S.), H. J. Kim et al: "Theoretical and Empirical Studies of Impurity Incoporation Into Beta-SiC Thin Films During Epitaxial Growth," pp. 2350–2357, see abstract; FIG. 3.
Inorganic Materials, vol. 13, No. 8, Aug., 1977, Plenum Corp. Publ. (New York, N.Y., U.S.), translation of Neorganicheski Materialy, vol. 13, No. 8, Aug., 1977, pp. 1419–1423, Izvestiya Akademii Nauk (SSSR).
M. I. Aivazov et al: "Interatomic in Mononitrides, Carbides, Oxides, and Diborides of 3d-Metals," pp. 1147–1151, see p. 1148, Table 1.
Solid State Technology, vol. 28, No. 11, Nov. 1985, Cowan Publ. Corp. (Port Washington, N.Y. U.S.), J. D. Parsons et al: "Unlocking the Potential of Beta Silicon Carbide," pp. 133–139, see abstract.

Primary Examiner—Andrew J. James
Assistant Examiner—Sara W. Crane
Attorney, Agent, or Firm—P. M. Coble; V. D. Duraiswamy; W. K. Denson-Low

[57] ABSTRACT

A new type of semiconductor material is disclosed which consists of a $\beta$-SiC:metal carbide alloy having the general formula Si$_w$(metal 1)$_x$(metal 2)$_y$(metal 3)$_z$C, where $w+x+y+z=1$ and $1>w>0$. The metals are selected from the group consisting of Ti, Hf, Zr, V, Ta, Mo, W and Nb, with Ti, Hf, and Zr preferred. By selecting appropriate proportions of metal carbide and SiC, the alloy's bandgap may be tailored to any desired level between the bandgaps of the metal carbide and SiC. Semiconductor devices are preferably formed by epitaxially growing a layer of the new alloy upon a substrate having a $\beta$-SiC or TiC type crystal structure. In addition to retaining the benefits of single-bandgap $\beta$-SiC with certain advantages, the new alloys make it possible to implement various electrical devices that cannot be achieved with $\beta$-SiC, and also have a potential for bandfolded superlattices for infrared detectors and lasers.

18 Claims, 3 Drawing Sheets

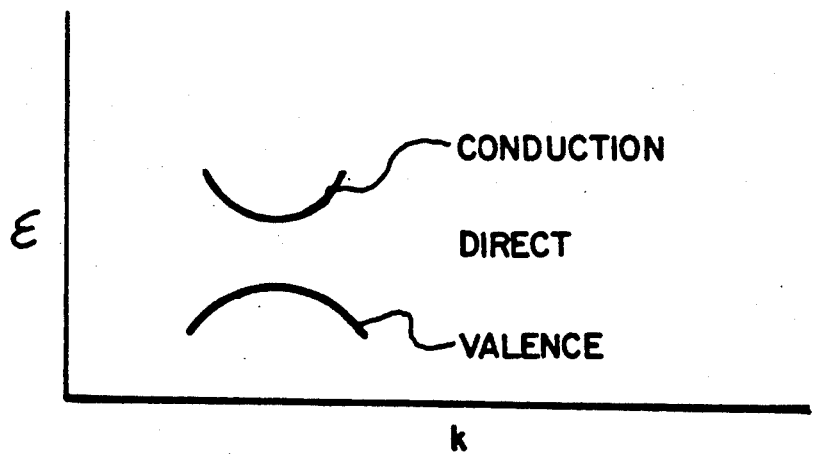
Fig. 4.
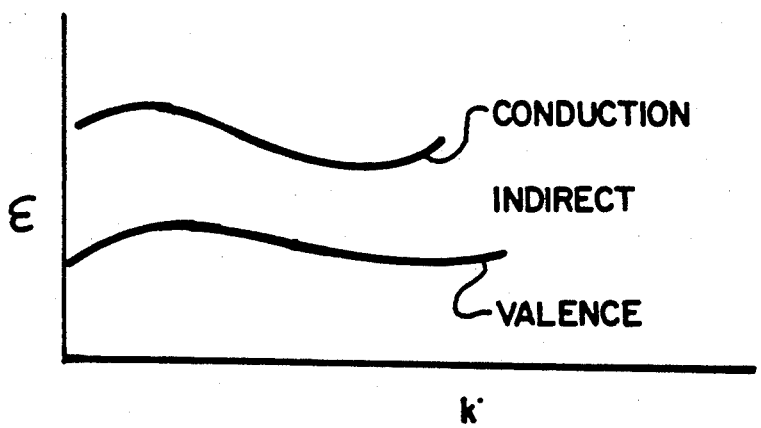
Fig. 5.
```
C S C S C S C          C T C S C T C
S C S C S C S          T C S C T C S
C S C S C S C          C S C T C S C
S C S C S C S          S C T C S C T
C S C S C S C          C T C S C T C
S C S C S C S          T C S C T C S
C S C S C S C          C S C T C S C
        βSiC            Si.5 Ti.5 C
```
Fig. 6.  Fig. 7.

```
C  T  C  S  C  S  C
T  C  S  C  S  C  S
C  S  C  S  C  S  C
S  C  S  C  S  C  T
C  S  C  S  C  T  C
S  C  S  C  T  C  S
C  S  C  T  C  S  C
                Si.75 Ti.25 C
```
Fig.8.
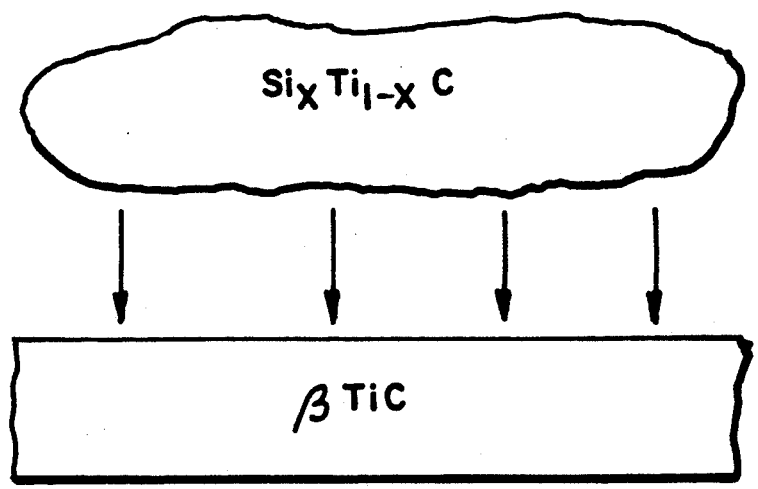
Fig.9.
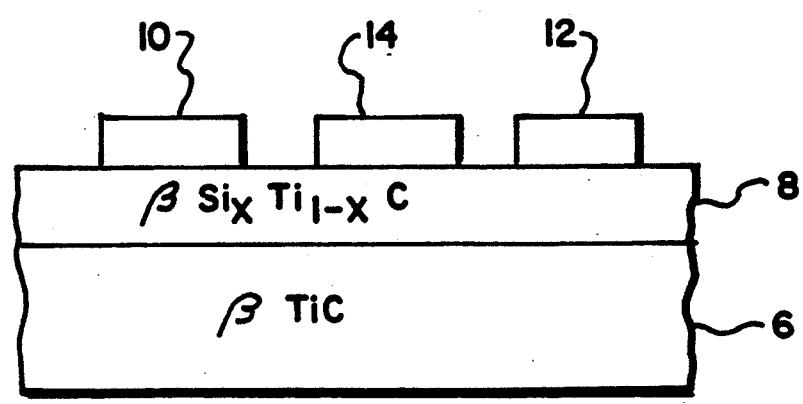
Fig.10.

SILICON CARBIDE:METAL CARBIDE ALLOY SEMICONDUCTOR AND METHOD OF MAKING THE SAME

BACKGROUND OF THE INVENTION

1. Field of the Invention

This invention relates to semiconductor materials and methods of forming the same, and more particularly to $\beta$-silicon carbide semiconductors.

2. Description of the Related Art

Silicon has gained acceptance as the basic semiconductor material, with other semiconductors such as GaAs used for limited applications such as extra high speed operations. However, both silicon and GaAs have significant limitations in terms of voltage breakdown levels, saturated electron drift velocity and the density of devices that can be implemented with these materials. Furthermore, it is not practical to make heterostructure devices with silicon, and both silicon and GaAs have fixed bandgaps that cannot be changed for different applications.

A new type of semiconductor referred to as beta silicon carbide($\beta$-SiC) has been developed recently which generally retains the operating features of more conventional semiconductors, but has significant advantages. As compared with both silicon and GaAs, $\beta$-SiC exhibits a very high breakdown voltage, a high saturated electron drift velocity which makes it useful for extremely high frequencies, and a high thermal conductivity which aids in heat dissipation and a consequent capability for a very high density of devices. In addition, the wide bandgap and superior high electric field properties of $\beta$-SiC, in conjunction with advances in submicron semiconductor processing technology, offer the possibility of significant breakthroughs in size, power, speed, operating temperature and radiation resistance of solid state semiconductor devices and integrated circuits. This new semiconductor and its potential applications are described in J. D. Parsons, R. F. Bunshah and O. M. Stafsudd "Unlocking the Potential of Beta Silicon Carbide", *Solid State Technology*, November 1985, pages 133-139.

While $\beta$-SiC has very significant advantages that make it a potential replacement for silicon as the basic semiconductor, it also has some limitations. Like silicon, its bandgap is fixed and prevents it from being used for several types of devices such as high electron mobility transistors (HEMT), avalanche photo diodes (APD), heterojunction bipolar transistors, impact avalanche transit time diodes (IMPATT) with narrow bandgap avalanche regions, and bandfolded superlattices for infrared detectors and lasers. Furthermore, $\beta$-SiC has a low low-field mobility which reduces maximum operating frequency of a metal-semiconductor-field effect transistor (MESFET) near the source and drain contact.

SUMMARY OF THE INVENTION

In view of the above problems with the related art, the object of the present invention is to provide a family of semiconductor materials which retain the advantages of $\beta$-SiC over more conventional semiconductors, and yet is applicable to a greater range of devices, has a bandgap which can be readily adjusted and tailored to the desired application, and has a higher low-field mobility.

This objective is realized with a new class of semiconductors consisting of metal-carbide:SiC alloys having a TiC or beta SiC crystal structure, approximately the same lattice parameter, and the general formula $Si_w$(metal 1)$_x$(metal 2)$_y$(metal 3)$_z$C, where $w+x+y+z=1$ and $1>w>0$. $\beta$-SiC and TiC both have cubic crystal structures, but their space groups are somewhat different; $\beta$-SiC has a diamond II-type structure, whereas TiC has space groups similar to NaCl. The metals are selected from the group consisting of Ti, Hf, Zr, V, Ta, Mo, W and Nb, and preferably from Ti, Hf, and Zr. The metal component should be selected so that the metal-carbon bonds in the alloy are predominantly covalent, only electrons in the outermost orbitals of the outermost electron shell contribute to bonding, and only the outermost d orbital electrons are available for conduction.

The new semiconductor can be specially tailored for applications requiring a specific bandgap energy level, between the bandgap energy levels of the metal carbide and the SiC, by selecting the relative proportions of metal carbide and SiC to yield the desired bandgap. In this manner, several devices can be implemented which are not presently available with either silicon or $\beta$-SiC.

The invention also includes a method for forming a semiconductor structure with the new material by epitaxially growing the alloy upon a substrate having a NaCl or $\beta$-SiC lattice structure and a lattice parameter matching substrate, preferably by chemical vapor deposition from a gaseous mixture of the alloy's constituent materials. The relative proportions of metal carbide and SiC are selected to yield the desired bandgap energy level for the alloy. The substrate upon which the semiconductor structure is grown preferably comprises single crystal TiC.

Further features and advantages of the present invention will be apparent to those skilled in the art from the following detailed description of preferred embodiments, taken together with the accompanying drawings, in which:

DESCRIPTION OF THE DRAWINGS

FIGS. 4 and 5 are energy diagrams illustrating direct and indirect bandgap semiconductors, respectively;

FIGS. 6, 7 and 8 are two-dimensional lattice diagrams illustrating the lattice structure for SiC, $Si_{0.5}Ti_{0.5}C$ and $Si_{0.75}Ti_{0.25}C$, respectively;

FIG. 9 illustrates the deposition of a metal carbide SiC alloy upon a substrate as an intermediate step in the formation of a semiconductor device and;

FIG. 10 is a sectional view of one possible finished device structure from FIG. 9.

DETAILED DESCRIPTION OF PREFERRED EMBODIMENTS

The present invention involves a new class of semiconductors consisting of Group IV Alloys of $\beta$-SiC and one or more metal carbides. $\beta$ is the conventional nomenclature for the 3C cubic lattice structure of SiC. The relative proportions of SiC and metal carbide are selected to yield a semiconductor having any desired bandgap energy level between the bandgaps of the SiC and the metal carbide. The band structure of the metal carbide should be similar to that of $\beta$-SiC to permit the growth of an alloy combining the two materials. The following metal carbides have been determined to have band structures with conduction band minimums and valence band maximas at K space positions near those of β-SiC, and are therefore candidates for use in forming the new semiconductor: Ti, Hf, Zr, Va, Ta, Mo, W and Nb. Their lattice parameters are all within about 5% of that of β-SiC, thus permitting the formation of an alloy rather than phase separation.

The particular metal carbide selected should meet several constraints to permit bandgap control, and also to permit electrical conduction by doping. The metal must combine with carbon to form a monocarbide; otherwise there may be too few electrons in the outer shell which will result in a self-doping effect. The metal-carbon bond should be predominantly covalent, rather than ionic, to form better semiconductor bonds and to prevent polarity effects in the bonding. Only the electrons in the outermost orbitals of the metal's outermost shell should contribute to the bonding; it is harder to dope the resulting material effectively if inner electrons contribute to the bonding. Finally, only the outermost d orbital electrons should be available for conduction, since this produces better bonding characteristics and facilitates conduction when doped.

The band structures of the carbides of the metals identified above are similar, and in some cases nearly identical, to β-SiC. In addition, the conduction band minimum and valence band maximums for these metal carbides are at or near the same values in K space as β-SiC. K space refers to momentum rather than distance space, and is also referred to as the reciprocal lattice. It is discussed, for example, in Sze, "Physics of Semiconductor Devices", Chap. 2, John Wiley & Sons, Inc., 1969. The location of conduction band minimums and valence band maximums in K space is discussed in L. A. Hemstreet and C. Y. Fong, "Recent Band Structure Calculations of Cubic and Hexagonal Polytypes of Silicon Carbide", Silicon-Carbide 1973, *Proceedings of the Third International Conference on Silicon Carbide,* Sep. 17-20, 1973, edited by R. C. Marshall, J. W. Faust, Jr. and C. E. Ryan.

Figure 1:
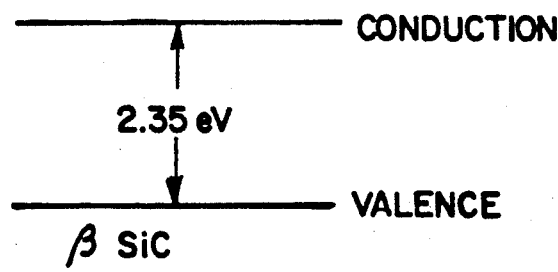
FIGS. 1 and 2 are energy diagrams illustrating the bandgaps of $\beta$-SiC and TiC, respectively.
Figure 2:
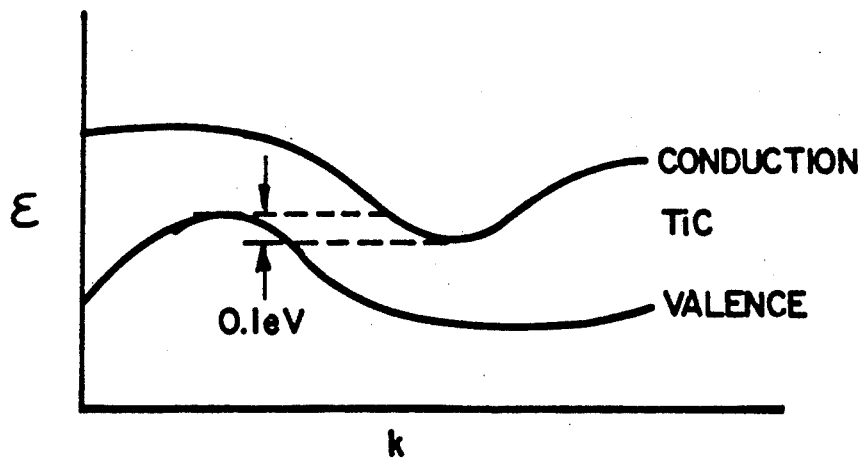
Figure 3:
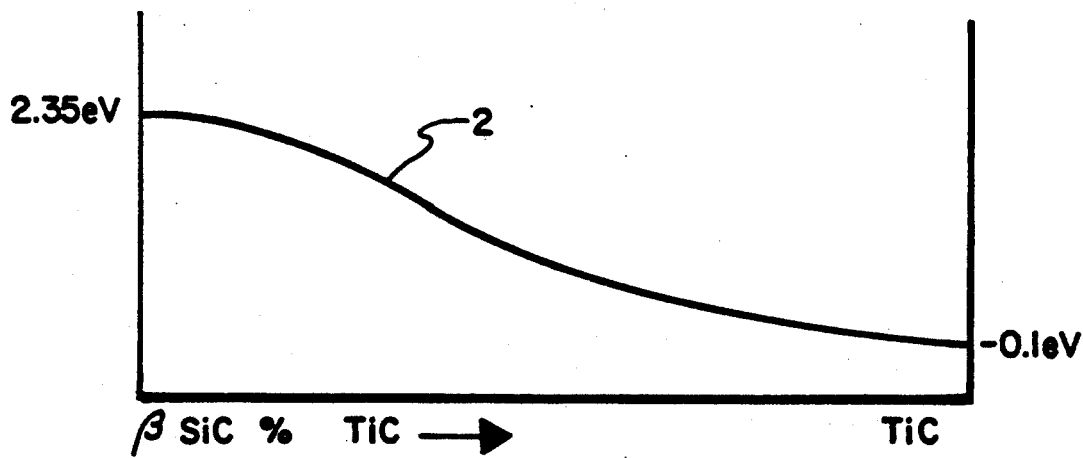
FIG. 3 is an energy diagram illustrating the selectability of the bandgap level for an SiC:TiC alloy.

TiC, ZrC, and HfC meet all of the above constraints and have lattice parameters which most closely match that of β-SiC, and therefore are the preferred metal carbides for use in the invention. Va, Ta, Mo, W and Nb can all have unpaired (unfilled) d bands, and thus can have d electrons which may not be sufficiently localized to prevent them from acting as conduction electrons. The implementation of the invention with a metal carbide consisting of TiC is illustrated in FIGS. 1-3. FIG. 1 illustrates the constant 2.35 eV bandgap energy of β-SiC, which is equal to the energy gap between the conduction and valence bands. FIG. 2 illustrates the bandgap of TiC in K space. It exhibits an indirect bandgap, meaning that the conduction minimum is displaced from the valence maximum in K space. The bandgap is approximately −0.1 eV, indicating that the conduction minimum is less than the valence maximum and the material is therefore a metal.

FIG. 3 illustrates, for an alloy consisting of β-SiC and the metal carbide, the dependence of the alloy's bandgap energy with the relative proportions of SiC and TiC. A semiconductor with 100% SiC is represented by the left hand vertical axis, while a metal with 100% TiC is illustrated by the right hand vertical axis. The bandgap energy for alloys of these two constituents will vary in a manner generally indicated by the curve 2, beginning at 2.35 eV on the β-SiC axis, and decreasing to −0.1 eV on the TiC axis. The curve for any particular metal carbide will generally be non-linear, and must be determined empirically. However, the curve will be non-varying and monotonic, i.e., it will be continuous with no discontinuities.

In general, the bandgap energy curve for any particular β-SiC-metal alloy will be monotonic if the k locations of the conduction band minimum and valence band maximum are approximately the same for the metal as for SiC; this condition is satisfied with the metals identified above. A monotonic bandgap curve is very helpful in reliably engineering a semiconductor material within the present new class of semiconductors to have a desired bandgap. A semiconductor with any desired bandgap between the 2.35 eV and −0.1 eV limits for β-SiC can be constructed simply by selecting the appropriate proportions of β-SiC and TiC which yield the desired bandgap from the curve.

While the invention has been illustrated by referring to a semiconductor consisting of an alloy of β-SiC and a single metal carbide, more than one metal may be employed. For example, a quaternary alloy having the formula $Si_{0.5}Ti_{0.24}Zr_{0.26}C$ would be suitable for applications requiring its corresponding bandgap. Although theoretically any number of the metals identified above could be employed, a practical limit of three different metals will prevail if they are limited to the preferred group of Ti, Zr and Hf. A general formula for an alloy of this type is:

$$Si_w(\text{metal 1})_x(\text{metal 2})_y(\text{metal 3})_z C,$$

where $w + x + y + z = 1$ and $1 > w > 0$.

A ternary alloy with two different metals is achieved by setting z equal to zero, while a binary allow with only one metal carbide is achieved by setting both y and z to zero.

It is theoretically desirable that the alloy employ direct bandgap materials, so that it can be used with lasers. A direct bandgap semiconductor is defined as one in which the conduction band minimum is generally aligned in K space with the valence band maximum, and is illustrated in FIG. 4. It requires only a single photon to excite an electron up from the valence to the conduction band. An indirect bandgap semiconductor, illustrated in FIG. 5, has a conduction band minimum which is offset in K space from the valence band maximum. It requires both a photon to excite the electron up from the valence to the conduction band, and a phonon to excite the electron laterally in K space. Since SiC is an indirect bandgap material, the metal carbide SiC alloy should similarly be indirect bandgap.

Bandgap variation by the selection of a particular alloy composition has previously been accomplished in a different context with AlGaAs. For example, see "Semiconductor Lasers and Heterojunction LEDA" by Henry Kressel & J. K. Butler, Chap. 11, pages 357-96, Academic Press, 1977. However, AlGaAs does not have the advantageous environmental thermal stability, high electric field and bandgap range properties of the metal carbide β-SiC alloys described herein.

Referring now to FIG. 6, a two-dimensional representation of the lattice structure for β-SiC is illustrated, with S representing a silicon atom and C a carbon atom. The atoms are arranged in a regular cubic β pattern, the carbon atoms alternating with silicon atoms. Each atom of one material forms bonds with the atoms of the other material in each of the three axial directions.

FIG. 7 is a two-dimensional representation of an $Si_{0.5}Ti_{0.5}C$ lattice structure. In this case, every other silicon atom is replaced with a titanium atom. Referring back to FIG. 3, the resulting alloy's bandgap will be somewhere between the 2.35 eV $\beta$-SiC and $-0.1$ eV TiC levels, although probably not exactly half-way between since the bandgap curve is generally not linear.

FIG. 8 illustrates the crystal lattice structure of an alloy which is further up and to the left along the bandgap curve of FIG. 3, specifically $Si_{0.75}Ti_{0.25}C$. Again, the representation is two-dimensional, but it should be understood that the crystal lattice structure will also extend into and out of the page in a similar fashion. This alloy will have a greater bandgap than that of FIG. 7, since it is closer to the $\beta$-SiC axis of FIG. 3.

Thus, any particular bandgap level within the limits of the metal carbide SiC alloy can be achieved by selecting the appropriate proportions for the constituents. To date no method of predicting a bandgap curve for a particular type of alloy has been devised, and the curve must be determined empirically.

Alloys can be constructed within the present invention which retain the advantages of $\beta$-SiC, and which yield exceptionally stable, high temperature, high power, high frequency, radiation hard semiconductor and optical devices. The present alloys generally have a higher low-field mobility than $\beta$-SiC, and can be used as the active layer in MESFETs. Virtually any electronic device structure employing homostructures and/or heterostructures can be synthesized using the new alloys. In addition to the potential for displacing semiconductor and Group III-V semiconductors for electronic devices, the new alloys have potential applications for replacing lasers and infrared detector structures, as well as HgCdTe infrared detectors.

A preferred fabrication technique for forming a device with the new alloys is illustrated in FIGS. 9 and 10. Referring first to FIG. 9, the alloy atoms are provided in a gaseous phase 4 and deposited by chemical vapor deposition onto a suitable substrate 6. The various alloy materials are each introduced in a gaseous phase and mixed together in an empirically determined ratio. The relative proportion of materials in the gaseous phase is generally not the same as their relative proportions when deposited as an alloy on the substrate. The relationship between the proportions of materials in the gaseous and deposited stages depends on factors such as pressure, temperature and flow rate, and is determined empirically. The chemical vapor deposition yields an epitaxial growth of the alloy material 4 upon the substrate 6. The substrate should accordingly have a lattice parameter which is similar to that of the alloy to facilitate epitaxial growth. A preferred substrate material is single crystal TiC.

FIG. 10 illustrates a finished semiconductor device, which in this case is an FET. A semiconductor layer, which for this example consists of $\beta$-SiTiC with a desired proportion between Si and Ti, has been epitaxially grown over the substrate 6. After suitable doping to form a channel region, source and drain contacts 10, 12 and gate contact 14 are formed to complete the device.

While the formation of a rather simple device has been illustrated, it should be realized that many types of different devices are possible with the new alloy semiconductor. These include devices which could not previously been implemented with $\beta$-SiC, such as high electron mobility transistors, superior avalanche photo diodes, heterojunction bipolar transistors, implant avalanche transit time diodes with narrow bandgap avalanche regions, and band folded superlattices for infrared detectors and lasers.

Thus, while specific embodiments of the invention have been described and illustrated, it should be understood that numerous variations and alternate embodiments will occur to those skilled in the art. Accordingly, it is intended that the invention be limited only in terms of the appended claims.

We claim:

1. A semiconductor material comprising a metal carbide: $\beta$-SiC alloy with a homogeneous single phase cubic crystal structure and having the formula $Si_w$(metal 1)$_x$(metal 2)$_y$(metal 3)$_z$C, where $w+x+y+z=1$, $1>w>0$ and said metals have lattice parameters within about 5% of that of $\beta$-SiC.

2. The semiconductor material of claim 1, in which metals 1, 2 and 3 are each selected from the following metals: Ti, Hf, Zr, V, Ta, Mo, W and Nb.

3. The semiconductor material of claim 2, in which metals 1, 2 and 3 are each selected from the following metals: Ti, Hf and Zr.

4. The semiconductor material of claim 1, wherein $y=z=0$.

5. The semiconductor material of claim 4, in which metal 1 is selected from the following metals: Ti, Hf, Zr, V, Ta, Mo, W and Nb.

6. The semiconductor material of claim 5, in which metal 1 is selected from the following metals: Ti, Hf and Zr.

7. The semiconductor material of claim 1, wherein said material has a $\beta$-SiC or TiC type crystal structure.

8. The semiconductor material of claim 1, wherein the relative proportions of metal carbide and $\beta$-SiC in said alloy are selected to yield a bandgap energy level for the alloy between the bandgap energy levels of the metal carbide and SiC.

9. A semiconductor material comprising an alloy of $\beta$-SiC and at least one metal, said alloy having a homogeneous single phase cubic crystal structure, the metal being selected so that the metal-carbon bonds in the alloy are predominantly covalent, only electrons in the outermost orbitals of the outermost electron shell contribute to bonding, only the outermost d orbital electrons are available for conduction, and its lattice parameters are within about 5% of that of $\beta$-SiC.

10. The semiconductor material of claim 9, said metal being selected from the group consisting of Ti, Hf and Zr.

11. An electrical semiconductor device, comprising:
a chemically stable, lattice matching substrate,
an epitaxial semiconductor layer on the substrate having a homogeneous single phase $\beta$-SiC or TiC type crystal structure, said layer formed from a semiconductor material which comprises a metal-carbide SiC alloy having the formula $Si_w$(metal 1)$_x$(metal 2)$_y$(metal 3)$_z$C, where $w+x+y+z=1$, $1>w>0$ and said metal have lattice parameters within about 5% of that of $\beta$-SiC, and
an electric circuit device formed upon and incorporating at least a portion of said semiconductor layer.

12. The semiconductor device of claim 11, in which metals 1, 2 and 3 are each selected from the following metals: Ti, Hf, Zr, V, Ta, Mo, W and Nb.

13. The semiconductor device of claim 12, in which metals 1, 2 and 3 are each selected from the following metals: Ti, Hf and Zr.

14. The semiconductor device of claim 11, wherein y=z=0.

15. The semiconductor device of claim 14, in which metal 1 is selected from the following metals: Ti, Hf, Zr, V, Ta, Mo, W and Nb.

16. The semiconductor device of claim 15, in which metal 1 is selected from the following metals: Ti, Hf and Zr.

17. The semiconductor device of claim 11, wherein said substrate comprises a single crystal TiC.

18. The semiconductor device of claim 11, wherein the relative proportions of metal carbide and SiC in said alloy are selected to yield a bandgap energy level for the alloy between the bandgap energy levels of the metal carbide and SiC.

* * * * *